(12) United States Patent
Niu et al.

(10) Patent No.: US 9,859,116 B2
(45) Date of Patent: Jan. 2, 2018

(54) SOLUTION-PROCESSED SOL-GEL FILMS INCLUDING A CRYSTALLIZATION AID, DEVICES INCLUDING SAME, AND METHODS

(71) Applicant: SAMSUNG ELECTRONICS CO., LTD, Suwon-si (KR)

(72) Inventors: Yuhua Niu, Waltham, MA (US); Peter T. Kazlas, Sudbury, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/296,163

(22) Filed: Jun. 4, 2014

(65) Prior Publication Data

US 2015/0001528 A1  Jan. 1, 2015

Related U.S. Application Data

(63) Continuation of application No. PCT/US2012/059012, filed on Oct. 5, 2012.
(Continued)

(51) Int. Cl.
*H01L 21/02*  (2006.01)
*H01L 51/50*  (2006.01)
(Continued)

(52) U.S. Cl.
CPC .... *H01L 21/02628* (2013.01); *C23C 18/1216* (2013.01); *C23C 18/1233* (2013.01);
(Continued)

(58) Field of Classification Search
CPC .......... H05B 33/22; H05B 33/18; B05D 5/12; B29C 39/12; C08F 283/00; H01L 33/04;
(Continued)

(56) References Cited

U.S. PATENT DOCUMENTS 5,143,988 A * 9/1992 Wang .................... C04B 28/003
                                                        525/471
5,391,393 A    2/1995 Maniar
(Continued)

FOREIGN PATENT DOCUMENTS

KR    20100036055 A    4/2010
WO    WO2007095173 A2  8/2001
(Continued)

OTHER PUBLICATIONS

Cho, et al., "High-performance crosslinked colloidal quantum-dot light-emitting diodes", *Nature Photon* 3, pp. 341-345 (2009).
(Continued)

*Primary Examiner* — Selim Ahmed
(74) *Attorney, Agent, or Firm* — Cantor Colburn LLP

(57) ABSTRACT

A method for preparing a sol-gel film is disclosed. The method comprises providing a sol-gel composition comprising one or more sol-gel film precursors and a crystallization aid, and processing the sol-gel composition by solution processing to form the sol-gel film. In certain embodiments, the sol-gel film comprises one or more metal oxides. A preferred crystallization aid includes triphenylphosphine oxide. A composition for making a sol-gel film, a sol-gel film, a device including a sol-gel film and a method for making such device are also disclosed.

12 Claims, 1 Drawing Sheet

Related U.S. Application Data

(60) Provisional application No. 61/568,354, filed on Dec. 8, 2011.

(51) Int. Cl.

| | | |
|---|---|---|
| *C23C 18/12* | (2006.01) | |
| *H01L 29/15* | (2006.01) | |
| *H01L 29/24* | (2006.01) | |

(52) U.S. Cl.
CPC ...... *C23C 18/1241* (2013.01); *C23C 18/1245* (2013.01); *C23C 18/1254* (2013.01); *H01L 21/02565* (2013.01); *H01L 29/15* (2013.01); *H01L 29/24* (2013.01); *H01L 51/5072* (2013.01); *C23C 18/1275* (2013.01); *C23C 18/1283* (2013.01); *H01L 2251/303* (2013.01)

(58) Field of Classification Search
CPC ............. H01L 51/5012; H01L 51/5088; H01L 51/5048
USPC .......................................... 257/13, E33.008
See application file for complete search history.

(56) References Cited

U.S. PATENT DOCUMENTS

| | | | |
|---|---|---|---|
| 7,318,651 | B2 | 1/2008 | Chua et al. |
| 7,910,400 | B2 | 3/2011 | Kwon et al. |
| 8,470,617 | B2 | 6/2013 | Coe-Sullivan et al. |
| 8,845,927 | B2 | 9/2014 | Breen et al. |
| 9,054,329 | B2 | 6/2015 | Coe-Sullivan et al. |
| 2002/0110180 | A1 | 8/2002 | Barney et al. |
| 2003/0142944 | A1 | 7/2003 | Sundar et al. |
| 2005/0116621 | A1 | 6/2005 | Bellman et al. |
| 2006/0105200 | A1 | 5/2006 | Poplavskyy et al. |
| 2007/0001581 | A1 | 1/2007 | Stasiak et al. |
| 2007/0034833 | A1 | 2/2007 | Parce et al. |
| 2007/0045777 | A1 | 3/2007 | Gillies et al. |
| 2007/0069202 | A1 | 3/2007 | Choi et al. |
| 2007/0103068 | A1 | 5/2007 | Bawendi et al. |
| 2007/0152370 | A1 | 7/2007 | Roberts et al. |
| 2008/0237540 | A1 | 10/2008 | Dubrow |
| 2010/0001256 | A1 | 1/2010 | Coe-Sullivan et al. |
| 2010/0167011 | A1 | 7/2010 | Dubrow |
| 2010/0247923 | A1 | 9/2010 | Hsu |
| 2011/0140075 | A1* | 6/2011 | Zhou ............... B82Y 20/00 257/13 |
| 2011/0287566 | A1 | 11/2011 | Jang et al. |
| 2012/0138894 | A1 | 6/2012 | Qian et al. |
| 2012/0292594 | A1 | 11/2012 | Zhou et al. |
| 2013/0009131 | A1 | 1/2013 | Kazlas et al. |
| 2013/0037778 | A1 | 2/2013 | Kazlas et al. |

FOREIGN PATENT DOCUMENTS

| | | |
|---|---|---|
| WO | WO2006077256 A1 | 7/2006 |
| WO | WO2007117698 A2 | 10/2007 |
| WO | WO2007143197 A2 | 12/2007 |
| WO | WO2009035657 A1 | 3/2009 |
| WO | WO2009123763 A2 | 10/2009 |
| WO | WO2011044391 A1 | 4/2011 |
| WO | WO2011060180 A1 | 5/2011 |
| WO | WO2012138409 A2 | 10/2012 |
| WO | WO2013085611 A1 | 6/2013 |

OTHER PUBLICATIONS

Etter, et al., "Triphenylphosphine Oxide as a Crystallization Aid", *J. Am. Chem. Soc.* (1988), vol. 110, pp. 639-640.
Ha, M.Y., et al., "Organic light-emitting devices with triphenylphosphine oxide layer", *Synthetic Metals* (2008), vol. 158, pp. 617-619.
Hoyer, et al., "Potential-Dependent Electron Injection in Nanoporous Colloidal ZnO Films", *J. Phys. Chem.*, (1995), vol. 99, pp. 14096-14100.
Kwon; S-J, et al., "Soft-chemistry Route to P-I-N Heterostructured Quantum Dot Electroluminescence Device: All Solution-Processed Polymer-Inorganic Hybrid QD-EL Device", *Mater. Res. Soc. Symp. Proc.* (2007) vol. 959.
Mashford, et al., "All-inorganic quantum-dot light-emitting devices formed via low-cost, wet-chemical processing", *J. Mater. Chem.* 20, 167-172 (2010).
Mashford, et al., "High-efficiency quantum-dot light-emitting devices with enhanced charge injection", *Nature Photonics* 7, pp. 407-412 (2013).
Matijevic, "Preparation and characterization of monodispersed metal hydrous oxide sols", *Progr. Colloid & Polymer Sci.*, vol. 61, pp. 24-35 (1976).
Miller, et al., "Microstructural evolution of sol-gel derived ZnO thin films", *Thin Solid Films*, vol. 518 (2010), pp. 6792-6798.
Ohmori, et al., "Photovoltaic properties of phthalocyanine based p-n diode evaporated onto titanium dioxide", *Thin Solid Films* 2006, vol. 499, pp. 369-373.
PCT/US2012/059012 Search Report and Written Opinion dated Mar. 21, 2013. PCT/US2012/059012 is the parent of this case.
Qian, L. et al. "Electroluminescence from light-emitting polymer/ZnO nanoparticle heterojunctions at sub-bandgap voltages" *Nano Today* (2010) vol. 5, pp. 384-389.
Qian, L. et al. "Stable and efficient quantum-dot light-emitting diodes based on solution-processed multilayer structures", *Nature Photonics*, vol. 5, pp. 543-548 (2011).
Stouwdam, J.W. et al., "Red, green, and blue quantum dot LEDs with solution processable ZnO nanocrystal electron injection layers" 2008 *Journal of Materials Chemistry*, vol. 18 pp. 1889-1894, published online Mar. 5, 2008.
Talapin, et al., "Prospects of colloidal nanocrystals for electronic and optoelectronic applications" *Chem. Reviews*, 2010, vol. 110, pp. 389-458.

\* cited by examiner

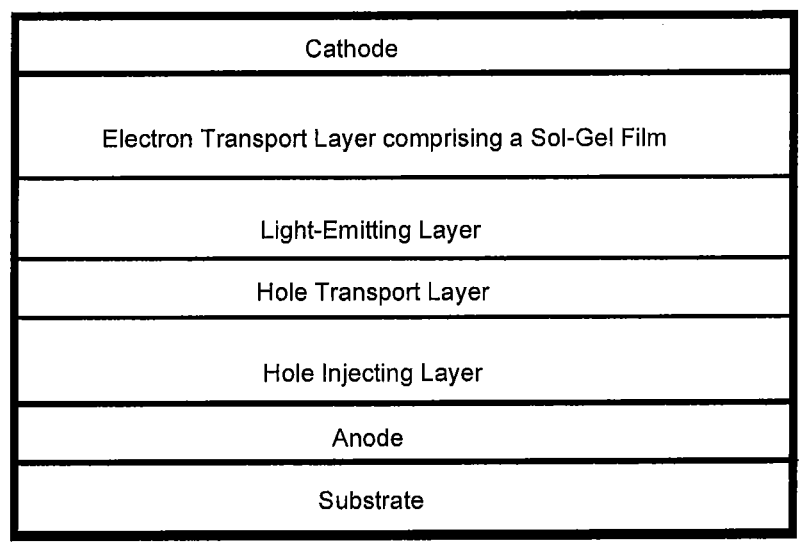

SOLUTION-PROCESSED SOL-GEL FILMS INCLUDING A CRYSTALLIZATION AID, DEVICES INCLUDING SAME, AND METHODS

This application is a continuation of International Application No. PCT/US2012/059012, filed 5 Oct. 2012, which was published in the English language as International Publication No. WO 2013/085611 on 13 Jun. 2013, which International Application claims priority to U.S. Provisional Patent Application No. 61/568,354 filed 8 Dec. 2011. Each of the foregoing is hereby incorporated herein by reference in its entirety for all purposes.

FEDERALLY SPONSORED RESEARCH OR DEVELOPMENT

This invention was made with Government support under Government Contract Number W909MY-09-C-0019 awarded by the U.S. Army CERDEC, NVESD, Imaging Technology Branch. The Government has certain rights in the invention.

TECHNICAL FIELD OF THE INVENTION

This invention relates to a solution-processed film, a composition for making same, a method for preparing a solution-processed film, a device including a solution-processed film, and methods of fabricating such devices.

SUMMARY OF THE INVENTION

In accordance with one aspect of the present invention, there is provided a method for preparing a sol-gel film comprising providing a sol-gel composition comprising one or more sol-gel film precursors and a crystallization aid, and processing the sol-gel composition by solution processing to form the sol-gel film.

In certain embodiments, the method is used for preparing a sol-gel film for use in a device.

In certain embodiments, solution processing is carried out in air or other oxygen containing atmosphere.

In certain embodiments, the sol-gel composition is processed at a temperature sufficient to form the sol-gel film from the sol-gel composition.

Examples of preferred crystallization aids include, but are not limited to, phosphine oxides such as tryiphenyl phosphine oxide, bis(4-fluorophenyl) phenylphosphine oxide, decyl(diphenyl)phosphine oxide, benzyl(diphenyl)phosphine oxide, and [2-(diphenylphosphoryl)ethyl](diphenyl) phosphine oxide.

In certain embodiments, the amount of crystallization aid included in the sol-gel composition is in a range from about 0.1 to about 10 weight percent of the weight of sol-gel film precursor(s). Other amounts outside this range may be determined to be useful or desirable.

In certain embodiments, a sol-gel film composition further comprises a solvent. Examples of preferred solvents include alcohols.

In certain embodiments, the sol-gel film comprises one or more metal oxides. In certain of such embodiments, the method comprises providing a sol-gel composition comprising one or more metal oxide precursors and a crystallization aid, and processing the sol-gel composition by solution processing to form the sol-gel film comprising one or more metal oxides. Solution processing is preferably carried out in air or other oxygen containing atmosphere.

In certain embodiments, a metal oxide precursor comprises a metal salt, hydrated metal salt, a metal alkoxide, a metal alkylalkoxide, etc. Examples of a metal salt include, but are not limited to, metal nitrate, metal sulfate, metal carboxylate (e.g., metal acetate, metal citrate, metal oxalate). Other metal oxide precursors may be determined to be useful or desirable.

In certain embodiments including a metal oxide precursor, the amount of crystallization aid included in the sol-gel composition is in a range from about 0.1 to about 10 weight percent of the weight of metal oxide precursor(s). Other amounts outside this range may be determined to be useful or desirable.

A preferred metal oxide comprises zinc oxide. In certain of such preferred embodiments, the method comprises solution processing a composition comprising a zinc oxide precursor and a crystallization aid at a low temperature, preferably less than 200° C., more preferably less than 185° C., most preferably less than or equal to about 150° C.

A sol-gel film composition may be formed on a substrate or a layer included in an electronic or optoelectronic device.

The substrate may be selected from: glass, plastic, quartz, metal foil, silicon wafer (doped or undoped). Other substrate materials may be used.

In certain embodiments, a device layer can be an electrode, a light emitting or light absorbing layer, in either case preferably comprising quantum confined semiconductor nanoparticles, a charge transport layer, a charge blocking layer, a charge injecting layer, etc.

In accordance with another aspect of the present invention, there is provided a sol-gel film composition comprising one or more sol-gel film precursors and a crystallization aid.

Examples of preferred crystallization aids are described in this application.

In certain embodiments, the amount of crystallization aid included in the sol-gel composition is in a range from about 0.1 to about 10 weight percent of the weight of sol-gel film precursor(s). Other amounts outside this range may be determined to be useful or desirable.

In certain embodiments, a sol-gel precursor comprises a metal oxide precursor. In certain of such embodiments, the amount of crystallization aid included in the sol-gel composition is in a range from about 0.1 to about 10 weight percent of the weight of metal oxide precursor(s). Other amounts outside this range may be determined to be useful or desirable.

In accordance with another aspect of the present invention, there is provided a sol-gel film comprising one or more metal oxides and a crystallization aid.

In certain embodiments, the sol-gel film is for use in device as a charge transport layer, the sol-gel film comprising one or more metal oxides and a crystallization aid.

In accordance with another aspect of the present invention, there is provided a device comprising a sol-gel film as described above, the sol-gel film being formed on a layer in a device and/or on substrate.

In certain embodiments, the sol-gel film may be a charge transport layer. The charge transport layer may comprise an electron transport layer or a hole transport layer. In certain embodiments, an electron transport layer may also comprise an electron injection layer.

The device preferably further comprises a layer comprising quantum confined semiconductor nanoparticles. The sol-gel film may be formed before or after the layer comprising quantum confined semiconductor nanoparticles.

The foregoing, and other aspects described herein, all constitute embodiments of the present invention.

It should be appreciated by those persons having ordinary skill in the arts) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description and drawings, from the claims, and from practice of the invention disclosed herein.

BRIEF DESCRIPTION OF THE DRAWINGS

In the drawings:

FIG. 1 depicts an example of a device in accordance with the invention.

The attached FIGURE is a simplified representation presented for purposes of illustration only; actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

FIG. 1 provides a schematic representation of an example of the architecture of a device including a sol-gel film according to one embodiment of the present invention as a charge transport layer.

Referring to FIG. 1, the depicted device example includes (from top to bottom) a cathode, a sol-gel film in accordance with the invention as a layer capable of transporting electrons (as referred to herein as an "electron transport layer"), a light-emitting layer, a layer comprising a material capable of transporting holes (also referred to herein as a "hole transport material"), a hole injecting layer, an anode, and a substrate. When voltage is applied across the anode and cathode, the anode injects holes into the hole injecting material while the cathode injects electrons into the electron transport material. The injected holes and injected electrons combine to form an exciton on the quantum confined semiconductor nanoparticles and emit light.

In certain embodiments, the cathode comprises silver.

In certain embodiments, the hole transport layer comprises poly(9,9'-dioctylfluorene-co-N-(4-butylphenyl)diphenylamine (TFB).

In certain embodiments, the hole injecting layer comprises PEDOT:PSS.

In certain embodiments, the light-emitting layer comprises quantum confined semiconductor nanocrystals. In certain embodiments, the light emitting layer comprises an organic light-emitting material. Such light emitting materials are known.

In certain embodiments, the anode comprises aluminum.

In certain embodiments, the substrate comprises glass or silicon.

Other materials may be determined to be useful or desirable for fabrication or inclusion in the various layers in the device. Other layers may further be optionally included.

In certain embodiments, a layer may comprise more than one layer.

In certain embodiments, the device structure can be inverted.

In certain embodiments, a hole transport layer and/or other layers in the device can comprise a sol-gel film in accordance with the invention.

Examples of various substrates, other charge transport materials, hole injection materials, electrode materials, quantum confined semiconductor nanocrystals, and other additional layers that may be optionally included in a device are described in U.S. patent application Ser. No. 11/354,185, filed 15 Feb. 2006, International Application No. PCT/US2009/002123 filed 3 Apr. 2009 of QD Vision, Inc. for "Light-Emitting Device Including Quantum Dots", International Application No. PCT/US2010/51867 of QD Vision, Inc., filed 7 Oct. 2010, and International Application No. PCT/US2010/56397 of QD Vision, Inc., filed 11 Nov. 2010, each of the foregoing hereby being incorporated herein by reference in its entirety.

The example of the device illustrated in FIG. 1 is a light emitting device, although a sol-gel film in accordance with the invention can be included in other types of electronic or optoelectronic devices. Examples of such devices include, but are not limited to, light-emitting devices, thin-film transistors, photodetectors, sensors, as well as photovoltaic cells.

A charge transport layer including the sol-gel may further comprise one or more additional sol-gel and/or non-sol-gel films. A non-sol-gel film may be organic, inorganic, hybrids, or mixtures thereof.

In certain embodiments, a sol-gel composition and/or film may be formed from precursors comprising a metal oxide precursor. Examples of a metal oxide precursor include, but are not limited to, a metal salt, hydrated metal salt, a metal alkoxide, a metal alkylalkoxide, etc. Examples of a metal salt include, but are not limited to, metal nitrate, metal sulfate, metal carboxylate (e.g., metal acetate, metal citrate, metal oxalate). Other metal salts may be determined to be useful or desirable as metal oxide precursors.

Examples of metal oxides include titania, zinc oxide, silicon oxide, etc. Other metal oxides may be determined to be useful or desirable for inclusion in a sol-gel film.

In certain preferred embodiments the sol-gel film comprises zinc oxide. Examples of metal oxide precursors for use in forming such film include, but are not limited to, zinc nitrate, zinc acetate, zinc citrate, zinc methacrylate, zinc sulfate and zinc oxalate, hydrated forms thereof or combinations thereof. In an embodiment, the zinc salt is zinc nitrate or hydrated zinc nitrate (e.g. zinc nitrate hexahydrate $Zn(NO_3)_2 \cdot 6H_2O$).

In certain embodiments, the amount of metal oxide precursor in the sol-gel composition can be greater than about 0.5M, e.g., in a range from about 0.5 to 0.9, in a range from about 0.6 to about 0.8M, etc. In certain embodiments, the amount of metal oxide precursor in the sol-gel composition is about 0.72M. Other amounts outside this range may be determined to be useful or desirable.

Examples of crystallization aids include, but are not limited to, phosphine oxides such as tryiphenyl phosphine oxide (TPPO), bis(4-fluorophenyl) phenylphosphine oxide (BFPPO), decyl(diphenyl)phosphine oxide (DDPPO), benzyl(diphenyl)phosphine oxide (BDPO), and [2-(diphenylphosphoryl)ethyl](diphenyl)phosphine oxide (2DDPPO).

(A sol-gel film including a crystallization aid comprising diphenylphosphine oxide may result in reduced brightness of a light emitting device including an emissive layer comprising quantum confined semiconductor nanoparticles.)

In certain embodiments, a crystallization aid comprises a phosphine oxide compound including three phenyl groups (which may be substituted or unsubstituted).

A crystallization aid comprising triphenylphosphine oxide (TPPO) can be preferred for inclusion in a sol-gel film comprising an electron transport layer in that is possesses electron-transport properties.

In certain embodiments, the effective amount of crystallization aid in the sol-gel composition can be less than or equal to 0.05M, and even as low as <0.001M. Other amounts outside this range may be determined to be useful or desirable.

In certain embodiments, the amount of crystallization aid included in the sol-gel composition is in a range from about 0.1 to about 10 weight percent of the weight of metal oxide precursor. In certain embodiments, the amount of crystallization aid included in the sol-gel composition is in a range from about 0.2 to about 6 weight percent of the weight of metal oxide precursor. Other amounts outside this range may be determined to be useful or desirable.

In certain embodiments, a sol-gel film comprising zinc oxide is prepared from a sol-gel composition including a metal salt, a crystallization aid, preferably TTPO, and a solvent, by heating in an oxygen containing environment.

In certain embodiments, the sol-gel film composition further comprises a solvent.

In certain embodiments, a preferred solvent can comprise an alcohol or mixture of alcohols. In certain embodiments, a solvent can comprise water, preferably deionized water. In certain embodiments, a solvent can comprise a mixture including water (preferably deionized water) and one or more alcohols. Other solvents may be determined to be useful or desirable.

In an embodiment, the alcohol solvent is selected so to be capable of dissolving the metal oxide precursor.

In one embodiment, the alcohol comprises an aliphatic alcohol having from 1-3 carbon atoms. For example, such alcohol can comprise methanol, ethanol, and/or propanol.

Solution processing to fabricate sol-gel films may comprise preparing a sol-gel composition by, for example, preparing a metal oxide precursor solution in a solvent, and a crystallization aid at room temperature and forming a layer thereof on a surface on which the sol-gel film is to be formed. Thereafter the layer is heated at a temperature sufficient to convert the metal oxide precursor to metal oxide. Preferably such temperature is less than 200° C. (e.g., preferably at 150° for forming zinc oxide) in air or other oxygen containing atmosphere for a period of time sufficient to convert zinc acetate to zinc oxide (e.g., 15-30 minutes at 150°). Solution processing is preferably carried out in air or other oxygen containing atmosphere.

In certain embodiments, heating of the sol-gel composition is carried out for a period of time sufficient to obtain a meta-state with sufficient electron-transport ability.

An example of one of the methods for forming the layer of sol-gel composition can comprise spin coating (e.g., ranges from 1000 rpm to 3000 rpm, e.g., 2000 rpm). Other spin-coating rates may be determined to be useful or desirable.

As described above, the sol-gel layer can be formed by depositing the sol-gel composition onto a substrate or other surface (e.g., a layer of a device).

A substrate may be of a material such as, for example, glass, plastic, quartz, metal foil, silicon (doped or undoped) with and without other materials or layers on the substrate. For example, a sol-gel film can be deposited onto a device layer (e.g., a layer comprising quantum dots, a charge transport layer, an electrode, etc.) formed directly or indirectly on a substrate (there may or may not be other materials or layers in between). Sol-gel films may be formed in an ambient atmosphere and/or under different conditions. The different conditions may have oxygen molecules and/or other molecules as the environment gas.

In certain embodiments, a sol-gel film prepared in accordance with the present invention can provide a smooth solid state film (preferably with a surface roughness (RMS) less than or equal to 1.5 nm, more preferably less than or equal to 1 nm, at a 500 nm scale)) at a low temperature (e.g., less than 200° C., less than 185° C., less than or equal to 150° C.). Such can be beneficial when underlying device layers (e.g., a quantum dot layer) and/or the performance thereof can be sensitive to higher temperatures.

Typically, the metal oxide precursor is converted to a metal oxide a temperature higher than ambient or room temperature.

In certain embodiments, devices in accordance with the invention can be fabricated, for example, by a method comprising forming a sol-gel film comprising a metal oxide by spin-coating a sol-gel composition comprising a crystallization aid (e.g., TPPO, etc.), a metal oxide precursor solution on top of already formed layer comprising quantum confined semiconductor nanoparticles. For example, by baking in air at low temperature that would not harm the light-emitting performance of the quantum confined semiconductor nanoparticles, a charge transport layer comprising a sol-gel film described herein can be formed in situ. A layer of conductive contact composed of inactive metal (like Al, Ag, Au, e.g., by thermal decomposition) can be formed thereover or a layer of conductive metal oxides (like ITO, IZO etc.) can be formed thereover (e.g., by sputtering), as top contact, the light-emitting diodes.

A sol-gel film formed from a zinc oxide metal precursor and TPPO can comprise a hybrid organic/inorganic electron transport/electron injecting layer in a device.

Depending on the selection of materials used to fabricate the device, such device can be top-emitting, bottom-emitting, or both (e.g., by choosing the transparency of the contact conductors and other device layers).

Films can be prepared by solution spin coating, casting, or printing under ambient conditions. Charge transport layers comprising sol-gel films described herein have application in commercial products such as, for example, backplanes for organic light emitting diodes, RFID tags, organic sensors, gas sensors, bio sensors, and ASICs.

Following is a non-limiting example describing preparation of an example of a sol-gel composition and sol-gel film in accordance with the invention.

EXAMPLE

Preparation of Sol-Gel Composition & Sol-Gel Film

A zinc acetate precursor solution is prepared from 12.56 g of zinc acetate dehydrate (99.999% purity from Aldrich), 76.8 ml of 2-methoxyethanol anhydrous (99.8% purity from Aldrich), and 3.2 ml of ethanolamine redistilled (99.5+% purity from Aldrich, optional). The precursor solution is mixed and shaken or magnetically stirred for several hours on a stirring plate.

A solution of TPPO is prepared from TPPO (from Aldrich) at a concentration of 50 mg/ml in 2-methoxyethanol anhydrous.

A sol-gel composition is prepared by mixing the zinc acetate precursor solution with the TPPO solution, in appropriate amounts, to obtain a sol-gel composition including zinc acetate dehydrate at a concentration of approximately 0.7M and TPPO at a concentration of about 7.5 mg/ml.

A sol-gel film is prepared on top of a layer comprising quantum confined semiconductor nanoparticles (QD Layer) in a partially fabricated device by spin-casting the sol-gel composition on the QD layer and baking same on a hotplate set at 150° C. in air for about 30 min. (The partial device further includes a hole transport layer comprising TFB under the QD layer and other device layers thereunder, such as, for example, those mentioned in the description of FIG. 1.)

Following heating, the partial device is moved into a vacuum oven in an inert-gas circulated glovebox to bake at 150° C. for another 30 min.

Thereafter, in a thermal deposition chamber, a metal cathode contact is formed thereover by either Ag or Al, or other metals; or a layer of conductive metal oxide is formed by sputtering; or by pasting certain cathode contact like Ag-paste.

The device is thereafter preferably encapsulated. For example, a device can be encapsulated by a cover glass with UV-curable epoxy.

A non-limiting example of quantum confined semiconductor nanoparticles that can be included in a QD layer in a light-emitting device is provided below. However, quantum confined semiconductor nanoparticles having different structures, compositions, and/or emission or absorption characteristics can be included in a device, based on the type of device and the desired performance characteristics thereof. Other preparation methods can also be used. Such selections can be readily made by one of ordinary skill in the art.

Preparation of Semiconductor Nanocrystals Capable of Emitting Yellow Light with Octadecylphosphonic Acid Synthesis of CdSe Cores:

26.23 mmol cadmium acetate are dissolved in 235.4 mmol of tri-n-octylphosphine at 100° C. in a 250 mL 3-neck round-bottom flask and then dried and degassed for one hour. 465.5 mmol of trioctylphosphine oxide and 59.8 mmol of octadecylphosphonic acid are added to a 0.5 L stainless steel reactor and dried and degassed at 140° C. for one hour. After degassing, the Cd solution is added to the reactor containing the oxide/acid and the mixture is heated to 270° C. under nitrogen. Once the temperature reaches 270° C., 243 mmol of tri-n-butylphosphine is injected into the flask. The temperature of the mixture is then raised to 298° C. where 60 mL of 1.5 M TBP-Se is then rapidly injected. The reaction is allowed to proceed for 20 seconds and then the heating mantle is removed from the reaction flask and the apparatus is quenched with a frozen squalane bath. The first absorption peak specification for the nanocrystals is 508 nm. The CdSe cores are precipitated out of the growth solution inside a nitrogen atmosphere glovebox by adding a 3:1 mixture of methanol and isopropanol. The isolated cores are then dissolved in hexane and used to make core-shell materials.

Synthesis of CdSe/CdZnS Core-Shell Nanocrystals:

517.3 mmol of trioctylphosphine oxide and 48.3 mmol of Octadecylphosphonic acid are loaded into a 0.5 L glass reactor. The mixture is then dried and degassed in the reactor by heating to 120° C. for about an hour. The reactor is then cooled to 70° C. and the hexane solution containing isolated CdSe cores (1.98 mmol Cd content) are added to the reaction mixture. The hexane is removed under reduced pressure followed by the addition of 85.33 mmol of decylamine. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. The Cd/Zn (5.84 mmol of dimethylcadmium and diethylzinc) and S (11.68 mmol of hexamethyldisilathiane) samples are each dissolved in 40 mL of trioctylphosphine inside a nitrogen atmosphere glove box. Once the precursor solutions are prepared, the reaction flask is heated to 155° C. under nitrogen. The precursor solutions are added dropwise over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dissolved in hexane and precipitated a second time by adding a 3:1 mixture of methanol and isopropanol. The isolated core-shell nanocrystals are then dispersed in hexane. The material specifications are as follows: Abs=560 nm; Emission=570 nm; FWHM=24 nm; QY=85% in Hexane Other materials, techniques, methods, applications, and information that may be useful with the present invention are described in, U.S. Patent Application No. 60/653,094 for "Light Emitting Device Including Semiconductor Nanocrystals", filed 16 Feb. 2005, U.S. patent application Ser. No. 11/354,185, filed 15 Feb. 2006, International Application No. PCT/US2009/002123 filed 3 Apr. 2009 of QD Vision, Inc. for "Light-Emitting Device Including Quantum Dots", International Application No. PCT/US2010/51867 of QD Vision, Inc., filed 7 Oct. 2010, International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2008/10651, of Breen, et al., for "Functionalized Nanoparticles And Method", filed 12 Sep. 2008, International Application No. PCT/US2007/013152, filed Jun. 4, 2007, of Coe-Sullivan, et al., for "Light-Emitting Devices And Displays With Improved Performance"; International Application No. PCT/US2007/003677, filed Feb. 14, 2007, of Bulovic, et al., for "Solid State Lighting Devices Including Semiconductor Nanocrystals & Methods". The disclosures of each of the foregoing listed patent documents are hereby incorporated herein by reference in their entireties.

As used herein, the singular forms "a", "an" and "the" include plural unless the context clearly dictates otherwise. Thus, for example, reference to an emissive material includes reference to one or more of such materials.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method for fabricating a sol-gel film comprising zinc oxide, the method comprising:
    providing a sol-gel composition comprising one or more zinc oxide precursors, a crystallization aid comprising a phenyl phosphine oxide compound, and a solvent, wherein the solvent comprises an alcohol or a mixture of alcohols; and
    processing the sol-gel composition by solution processing to form the sol-gel film.

2. A method in accordance with claim 1, wherein a zinc oxide precursor comprises a zinc salt.

3. A method in accordance with claim 1, wherein the sol-gel film is formed at a temperature less than about 200° C.

4. A method in accordance with claim 1, wherein the crystallization aid comprises a triphenylphosphine oxide compound.

5. A method in accordance with claim 1, wherein the phenyl phosphine oxide compound comprises triphenyl phosphine oxide, bis(4-fluorophenyl) phenyl phosphine oxide, decyl(diphenyl) phosphine oxide, benzyl(diphenyl) phosphine oxide, [2-(diphenylphosphoryl)ethyl](diphenyl) phosphine oxide, or a combination thereof.

6. A method in accordance with claim 5, wherein the phenyl phosphine oxide comprises triphenyl phosphine oxide.

7. A sol-gel composition comprising:
    a sol-gel film precursor comprising
        a zinc oxide precursor,
        a crystallization aid comprising a phenyl phosphine oxide compound, and a solvent comprising an alcohol or a mixture of alcohols.

8. A sol-gel composition in accordance with claim 7 wherein the crystallization aid is included in the sol-gel composition at a concentration less than or equal to 0.05M.

9. A sol-gel composition in accordance with claim 7 wherein the crystallization aid is included in the sol-gel composition in an amount in a range from about 0.1 to about 10 weight percent of the weight of the sol-gel film precursor.

10. A sol-gel composition in accordance with claim 9 wherein the sol-gel film precursor comprises a zinc salt and the crystallization aid comprises a triphenylphosphine oxide compound.

11. A sol-gel composition in accordance with claim 7 wherein the crystallization aid is included in the sol-gel composition in an amount in a range from about 0.2 to about 6 weight percent of the weight of the sol-gel film precursor.

12. An optoelectronic device comprising:
    a cathode;
    an electron transport layer, wherein the electron transport layer comprises a sol-gel film comprising zinc oxide; and a crystallization aid comprising a phenyl phosphine oxide compound;
    a light-emitting layer;
    a hole transport layer;
    a hole injection layer; and
    an anode.

* * * * *